(12) United States Patent
Song et al.

(10) Patent No.: US 12,736,588 B2
(45) Date of Patent: Sep. 15, 2026

(54) METHOD FOR RAPID BATTERY DIAGNOSIS BASED ON EDGE COMPUTING, STORAGE MEDIUM, AND ELECTRONIC DEVICE

(71) Applicant: Makesense Energy Technology Co., Limited, Shanghai (CN)

(72) Inventors: Pei Song, Shanghai (CN); Jian Zhao, Shanghai (CN); Guopeng Zhou, Shanghai (CN); Zonglin Cai, Shanghai (CN); Xiao Yan, Shanghai (CN); Enhai Zhao, Shanghai (CN)

(73) Assignee: Makesense Energy Technology Co., Limited, Shanghai (CN)

( * ) Notice: Subject to any disclaimer, the term of this patent is extended or adjusted under 35 U.S.C. 154(b) by 298 days.

(21) Appl. No.: 18/382,067

(22) Filed: Oct. 20, 2023

(65) Prior Publication Data

US 2024/0183913 A1 Jun. 6, 2024

(30) Foreign Application Priority Data

Oct. 25, 2022 (CN) ......................... 202211313564.1

(51) Int. Cl.

| | |
|---|---|
| ***G01R 31/392*** | (2019.01) |
| ***G01R 31/367*** | (2019.01) |
| ***G01R 31/3842*** | (2019.01) |
| ***G01R 31/396*** | (2019.01) |
| ***H02J 7/50*** | (2026.01) |
| ***H02J 7/80*** | (2026.01) |

(52) U.S. Cl.
CPC ......... *G01R 31/392* (2019.01); *G01R 31/367* (2019.01); *G01R 31/3842* (2019.01); *G01R 31/396* (2019.01); *H02J 7/50* (2026.01); *H02J 7/80* (2026.01)

(58) Field of Classification Search
CPC ................ G01R 31/392; G01R 31/367; G01R 31/3842; G01R 31/396; G01R 31/36
See application file for complete search history.

(56) References Cited

U.S. PATENT DOCUMENTS

| | | | | |
|---|---|---|---|---|
| 11,097,633 | B1 * | 8/2021 | Kohn | B60L 58/12 |
| 2021/0005939 | A1 * | 1/2021 | Tajima | H01M 10/482 |
| 2022/0052389 | A1 * | 2/2022 | Kwon | G06N 3/09 |
| 2023/0194614 | A1 * | 6/2023 | Negoita | G01R 31/396 |
| 2024/0125862 | A1 * | 4/2024 | Li | H01M 10/0525 |

* cited by examiner

*Primary Examiner* — Ricky Go
(74) *Attorney, Agent, or Firm* — IPRTOP LLC

(57) ABSTRACT

A method for rapid battery diagnosis based on edge computing, storage medium and electronic device. The method includes: periodically collecting battery information data from a battery management system at a preset frequency; performing convolution on the battery information data using first-order differential operators to obtain primary convolution results; identifying secondary convolution results that fall outside an underperforming threshold range based on the primary convolution results; and detecting anomalies in the battery information data based on the secondary convolution results and the battery information data. The present disclosed method allows for more precise and rapid processing of battery data on edge devices, enables a quick diagnosis of battery performance, and is easily scalable.

7 Claims, 3 Drawing Sheets

METHOD FOR RAPID BATTERY DIAGNOSIS BASED ON EDGE COMPUTING, STORAGE MEDIUM, AND ELECTRONIC DEVICE

CROSS REFERENCE TO RELATED APPLICATION

The present application claims the benefit of priority to Chinese Patent Application No. 202211313564.1, entitled "METHOD FOR RAPID BATTERY DIAGNOSIS BASED ON EDGE COMPUTING, STORAGE MEDIUM, AND ELECTRONIC DEVICE", filed with CNIPA on Oct. 25, 2022, the disclosure of which is incorporated herein by reference in its entirety for all purposes.

FIELD OF TECHNOLOGY

The present disclosure generally relates to the field of battery technology, in particular, to lithium battery performance analysis.

BACKGROUND

In the day-to-day operation of an energy storage power station, the Battery Management System (BMS) plays a crucial role. It constantly monitors key parameters such as voltages of individual cells, battery charge/discharge currents, and battery temperatures, and provides real-time protection. To predict the aging and health status of individual cells, related data is typically uploaded to a cloud-based platform, where extensive data analysis and forecasting are performed. While this method eventually yields desired analytical results, it does have its drawbacks. For example, the process of data collection and analysis can be lengthy, so the real-time performance may not be satisfactory. In more complex application scenarios, for instance, energy storage stations are only used for frequency regulation and peak shaving on the power generation side, leaving higher demands for battery stability and safety. Therefore, a method to detect underperforming batteries or those marginally performing batteries that is both fast and relatively simple is needed. This method should also be able to predict and diagnose the safety and health of batteries to a certain extent.

SUMMARY

The present disclosure provides a method for rapid battery diagnosis based on edge computing, including: periodically collecting battery information data from a battery management system (BMS) at a preset frequency; performing convolution on the battery information data using first-order differential operators to obtain primary convolution results; identifying secondary convolution results that fall outside an underperforming threshold range based on the primary convolution results; and detecting anomalies in the battery information data based on the secondary convolution results and the battery information data.

The present disclosure further provides a non-transitory storage medium, which stores program instructions, wherein the program instructions when executed implement the above-mentioned method for rapid battery diagnosis based on edge computing.

The present disclosure further provides an electronic device, comprising a memory configured to store a computer program; and a processor configured to execute the computer program to implement the above-mentioned method for rapid battery diagnosis based on edge computing.

The presently disclosed method for rapid battery diagnosis based on edge computing, storage medium, and electronic device have the following beneficial effects:

The present disclosure allows for more precise and rapid processing of battery data on edge devices, enables a quick diagnosis of battery performance, and is easily scalable.

BRIEF DESCRIPTION OF THE DRAWINGS

In order to more clearly illustrate the technical solutions in embodiments of the present disclosure, the following is a brief description of the accompanying drawings to be used in the description of the embodiments, it is obvious that the following description of the accompanying drawings are only some embodiments of the present disclosure, for a person of ordinary skill in the art, without creative work, other drawings can be obtained according to these accompanying drawings.

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It should be noted that the following embodiments and the features of the following embodiments can be combined with each other if no conflict will result.

The present disclosure provides a method for rapid battery diagnosis based on edge computing, storage medium, and electronic device, which solves the technical problem that related technologies are unable to diagnose performance of a battery effectively and rapidly.

To ensure that the present disclosed method for rapid battery diagnosis based on edge computing obtains more accurate analysis results, it is necessary to conduct persistent analysis based on battery data. Because edge-computing devices have limited arithmetic power and memory, the present disclosed method for rapid battery diagnosis based on edge computing first adopts slicing and time-sharing to process battery data, and then it weighs and accumulates the analysis results for all the time periods. The principles and embodiments of the method for rapid battery diagnosis based on edge computing, storage medium, and electronic device of the present disclosure will be described in detail below, so that a person skilled in the art can understand the method for rapid battery diagnosis based on edge computing, storage medium and electronic device of the present disclosure without creative labor.

Embodiment 1

Figure 1:
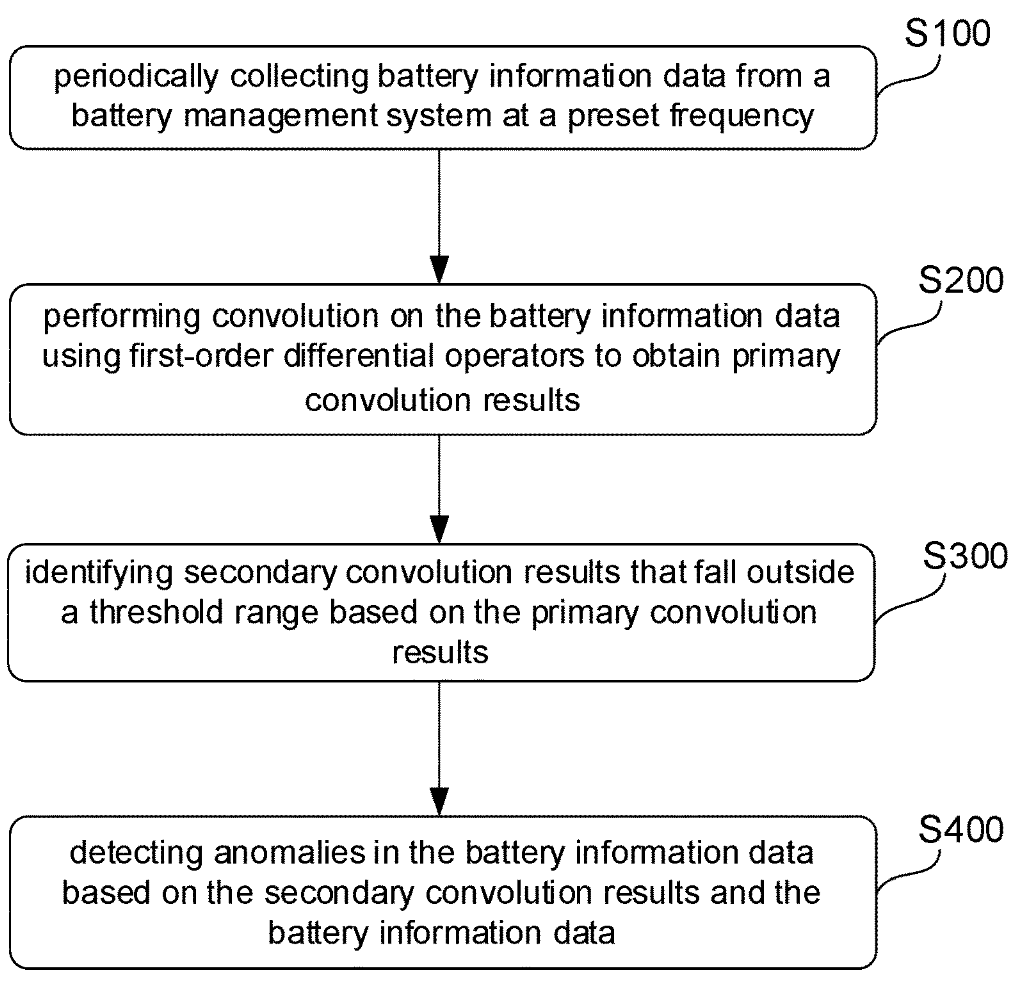
FIG. 1 shows a flowchart of a method for rapid battery diagnosis based on edge computing according to one embodiment of the present disclosure.

Embodiment 1 provides a method for rapid battery diagnosis based on edge computing; specifically, as shown in FIG. 1, the method for rapid battery diagnosis based on edge computing comprises steps S100-S400.

S100: periodically collecting battery information data from a BMS at a preset frequency;

S200: performing convolution on the battery information data using first-order differential operators to obtain the primary convolution results;

S300: identifying the secondary convolution results that fall outside an underperforming threshold range based on the primary convolution results;

S400: detecting anomalies in the battery information data based on the secondary convolution results and the battery information data.

Steps S100 to Step S400 of the method for rapid battery diagnosis based on edge computing are explained in detail below.

S100: periodically collecting battery information data from a BMS at a preset frequency.

As an example, the battery information data comprises voltages of battery cells of a battery pack and battery charge/discharge currents. As an example, the method further comprises: saving the voltages of cells in a two-dimensional array in the order of collection, and saving the battery charge/discharge currents in a one-dimensional array in an order of collection.

Specifically, as an example, key information data of the battery, i.e., the voltages of cells and the battery charge/discharge currents, are obtained from the BMS of the battery at a preset frequency, and during the process of collection, the voltages of cells are placed into a two-dimensional matrix A[N][M] for storage in the order of collection, and the battery charge/discharge currents are placed into a one-dimensional array B[N] for storage in the order of collection. When the matrix and array are fully occupied by the above data, data analysis thereof is then carried out.

S200: performing convolution on the battery information data using first-order differential operators to obtain primary convolution results.

As an example, performing convolution on the battery information data using first-order differential operators to obtain primary convolution results comprises: employing the first-order differential operators to perform horizontal convolution and vertical convolution on the two-dimensional matrix, respectively, to obtain a convolution result comprising horizontal gradient values and vertical gradient values.

As an example, before using a first-order differential operator to convolve the battery information data, the method further comprises:

1) selecting 3×3 first-order differential operators as initial first-order differential operators.

Standard 3×3 first-order differential operators Gx (horizontal) and Gy (vertical) may be constructed as follows:

$$Gx=\begin{bmatrix}1\\2\\1\end{bmatrix}*[-1\ \ 1\ \ -1]=\begin{bmatrix}-1&+2&-1\\-1&+2&-1\\-1&+2&-1\end{bmatrix},$$

-continued $$Gy=[1\ \ 2\ \ 1]*\begin{bmatrix}-1\\+1\\-1\end{bmatrix}\begin{bmatrix}-1&-1&-1\\+2&+2&+2\\-1&-1&-1\end{bmatrix}$$

2) expanding the initial (standard 3×3) first-order differential operators to obtain the first-order differential operators used to perform the convolution, which is performed by expanding a first one of the initial first-order differential operators horizontally to obtain an M×3 matrix and expanding a second one of the initial first-order differential operators vertically to obtain an N×3 matrix, wherein M is a total number of cells connected in series in the battery pack, and N is a total number of times that the battery information data has been collected. Herein N, M are positive integers.

Since the number M and N correspond to the actual scenario, the standard 3×3 operators are expanded to be equal to M and N which can be larger than 3×3, with one dimension horizontally expanded to an M×3 matrix, and the other dimension vertically expanded to an N×3 matrix, so as to construct operators with larger windows and increase the rate of convolution.

For example, Gx can be expanded to:

$$\begin{bmatrix}-1&+2&-1\\-1&+2&-1\\\dots&\dots&\dots\\\dots&\dots&\dots\\-1&+2&-1\end{bmatrix};$$

Gy can be expanded to:

$$\begin{bmatrix}-1&-1&\dots&\dots&-1\\+2&+2&\dots&\dots&+2\\-1&-1&\dots&\dots&-1\end{bmatrix}.$$

It can be seen that the method for rapid battery diagnosis based on edge computing utilizes the efficiency and directionality of edge detection algorithms, as well as the matricial structure of the original battery data, to construct suitable operators and expanded forms thereof, and rapidly locate sudden changes in voltage at a certain moment in massive data sets.

As an example, when employing the first-order differential operators to perform the horizontal convolution and the vertical convolution on the two-dimensional matrix, the first-order differential operators move with a step size of 1.

In order to quickly locate abnormal values of cells at a certain moment, the present disclosure adopts first-order differential operators to perform horizontal convolution and vertical convolution on a matrix composed of voltage data. In order to ensure the speed, the original 3×3 operators are expanded, with one horizontally expanded to an M×3 matrix, and the other one vertically expanded to an N×3 matrix. When moving the derivative operators, the step is set to 1 to obtain (and only obtain) gradient values between neighboring cells and gradient values between neighboring preset time points of a particular cell.

Figure 2:
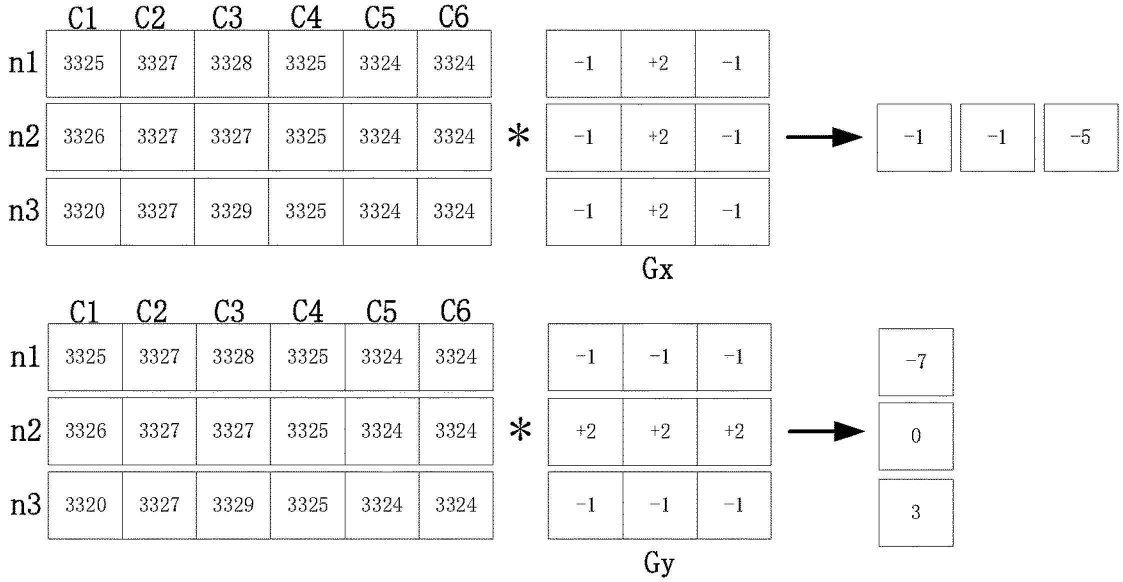
FIG. 2 shows a schematic diagram showing horizontal and vertical convolutions of raw voltage data in a method for rapid battery diagnosis based on edge computing according to one embodiment of the present disclosure.

The first-order differential operators are used to perform horizontal convolution and vertical convolution on raw voltage data, to obtain horizontal and vertical voltage difference approximations, respectively. As shown in FIG. 2, for example, for a six-cell battery pack, the matrix containing the raw voltage data obtained after three collections is convolved horizontally and vertically for the first, second, and third cells. There may be more cells in the battery pack, for example, seven, eight, nine, ten or eleven cells. More collections may be carried out, for example, four, five, six, seven, or eight collections may be carried out. For the example shown in FIG. 2, the horizontal convolution values are 3325+3327−3328*2=−1, 3326+3327−3327*2=−1, 3320+3329−3327*2=−5; the vertical convolution values are 3325+3320−3326*2=−7, 3327+3327−3327*2=0, 3328+3329−3327*2=3. Then, the operators are moved with a step of 1 to obtain (and only obtain) gradient values between neighboring cells and gradient values between neighboring preset time points of a particular cell.

S300: identifying secondary convolution results that fall outside an underperforming threshold range based on the primary convolution results.

As an example, the raw voltage data is convolved to obtain horizontal gradient values and vertical gradient values, which are compared with corresponding preset threshold ranges respectively, and if a gradient value is not within its preset threshold range, then further operations are carried out.

S400: detecting anomalies in the battery information data based on the secondary convolution results and the battery information data.

Specifically, as an example, detecting anomalies in the battery information data based on the secondary convolution results and the battery information data comprises:

1) if a first horizontal gradient value of the horizontal gradient values is not within a horizontal gradient range, retrieving first voltages of the voltages of the cells corresponding to the first horizontal gradient value from the two-dimensional matrix, calculating a voltage difference between two neighboring battery cells based on the first voltages, and determining whether or not there exists abnormality in a cell consistency within the battery pack based on magnitudes of the voltage difference between two neighboring battery cells and a voltage difference threshold. Herein, "voltage difference" refers to an inter-cell difference in operating voltage.
2) if a first vertical gradient value of the vertical gradient values is not within a vertical gradient range, retrieving second voltages of the voltages of the cells corresponding to the first vertical gradient value from the two-dimensional matrix, calculating a rate of voltage change with respect to time within a duration between two time points based on the second voltages, and determining whether or not there exist a cell within the battery pack that has a voltage abnormality, based on magnitudes of the rate of voltage change and a preset rate-of-voltage-change threshold.

If a vertical gradient value is abnormal (i.e., not within the vertical gradient range), it means that a large change occurs in a certain cell between two collections.

Furthermore, as an example, detecting anomalies in the battery information data based on the secondary convolution results and the battery information data further comprises:

if a first vertical gradient value of the vertical gradient values is not within a vertical gradient range, retrieving second voltages of the voltages of the cells corresponding to the first vertical gradient value from the two-dimensional matrix, calculating two or more values of a rate of voltage change with respect to time within different durations based on the second voltages, and retrieving the battery charge/discharge currents from the one-dimensional array; and determining whether or not there exist a cell within the battery pack that has a voltage abnormality, based on whether the rate of voltage change d V/dt varies with time in the same direction as the battery charge/discharge currents. That is, if there is no positive correlation between dV/dt and the present charge/discharge currents, then it can be determined that the present cell has an abnormal voltage.

Figure 3:
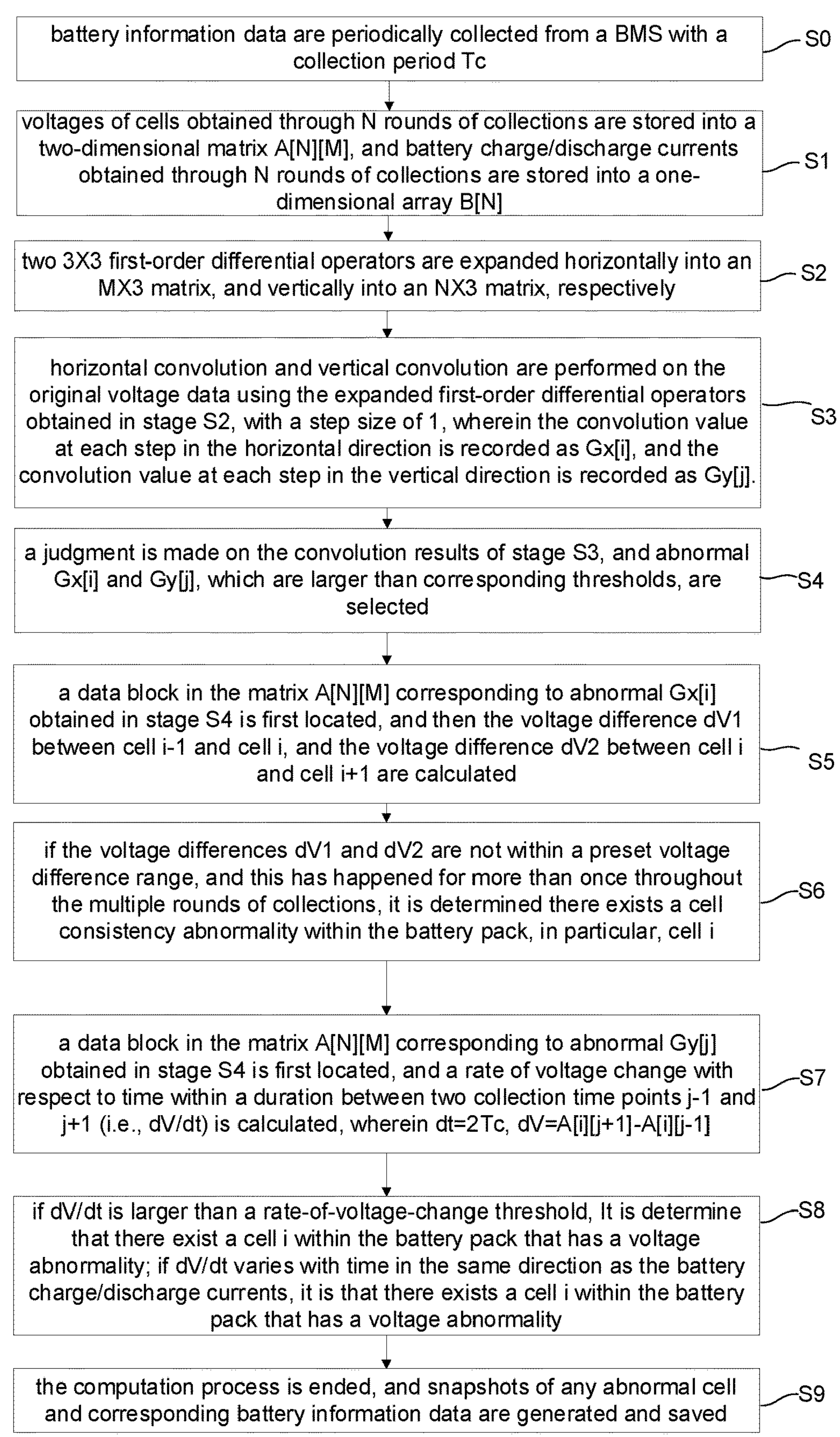
FIG. 3 shows a detailed flowchart of a method for rapid battery diagnosis based on edge computing according to one embodiment of the present disclosure.

To enable a person skilled in the art to further understand the principle of the method for rapid battery diagnosis based on edge computing, the method is further detailed in conjunction with FIG. 3.

As shown in FIG. 3, in stage S0, battery information data, i.e., voltages of battery cells in a battery pack and battery charge/discharge currents, are periodically collected from the BMS with a collection period Tc.

In stage S1, voltages of cells obtained through N rounds of collections are stored into a two-dimensional matrix A[N][M], and battery charge/discharge currents obtained through N rounds of collections are stored into a one-dimensional array B[N].

In stage S2, two 3×3 first-order differential operators are expanded horizontally into an M×3 matrix, and vertically into an N×3 matrix, respectively.

In stage S3, horizontal convolution and vertical convolution are performed on the original voltage data using the expanded first-order differential operators obtained in stage S2, with a step size of 1, wherein the convolution value at each step in the horizontal direction is recorded as Gx[i], and the convolution value at each step in the vertical direction is recorded as Gy[j]. To be clear, i is the specific cell from which the convolution value Gx[i] is acquired, and j is the specific collection when the convolution value Gy[j] is acquired.

In stage S4, a judgment is made on the convolution results of stage S3, and the abnormal Gx[i] and Gy[j] are selected which meet the criteria that they are larger than corresponding thresholds.

In stages S5, S6, further analysis is conducted on abnormal Gx[i] obtained in stage S4. Specifically, a data block in the matrix A[N][M] corresponding to this abnormal Gx[i] is first located, and then the voltage difference dV1 between cell i−1 and cell i, and the voltage difference dV2 between cell i and cell i+1 are calculated; if the voltage differences dV1 and dV2 are not within a preset voltage difference range, and this has happened for more than once throughout the multiple rounds of collections, it can be determined there exists a cell consistency abnormality within the battery pack, in particular, in the cell i.

In stages S7, S8, further analysis is conducted on abnormal Gy[j] obtained in stage S4. Specifically, a data block in the matrix A[N][M] corresponding to this abnormal Gy[j] is first located, and a rate of voltage change with respect to time within a duration between two collection time points j−1 and j+1 (i.e., d V/dt) is calculated, wherein dt=2Tc, dV=A[i][j+1]−A[i][j−1] (note that the letter i here may refer to any cell of the battery pack, not necessarily the same cell as the abnormal cell found in stage S6); if d V/dt is larger than a preset rate-of-voltage-change threshold, we can determine that there exist a cell i within the battery pack that has a voltage abnormality. In another example, multiple values of d V/dt are obtained based on different pairs of collection time points, and the battery charge/discharge currents are also retrieved from the one-dimensional array B[N]; if d V/dt varies with time in the same trend as the battery charge/discharge currents (which are magnitudes of electrical currents collected at different time points and stored in the order of collections), then we can also determine that there exists a cell i within the battery pack that has a voltage abnormality.

Therefore, the method for rapid battery diagnosis based on edge computing allows for precise and swift processing of battery data directly on edge devices. It leverages the benefits of edge computing, enabling quick analysis of substantial data volumes in a short time frame. The method uses weighted cumulative calculations to ensure prediction accuracy and is designed to be easily scalable. In the implementation of the algorithm, it is designed with a focus on ease of parallel computation, such as employing Field-Programmable Gate Array (FPGA) or Graphics Processing Unit (GPU) for accelerated parallel processing, which can harness the strengths of edge computing devices, thereby enabling rapid analysis of substantial data volumes in a short time frame. The method employs weighted cumulative calculations to ensure the accuracy of the analysis, leading to effective and efficient computational analysis.

In stage S9, the computation process is ended, and snapshots of any abnormal cell and corresponding battery information data are generated and saved. This data-snapshot function also facilitates comparison between edge data (i.e., data stored locally on edge devices) and cloud analysis data, and improves the safety of the whole power station.

In addition, optionally, after each single charge-discharge cycle, data weights are calculated based on the cumulative count of abnormal points recorded for each cell. The calculated results are then uploaded to the cloud or downloaded to the BMS.

Embodiment 2

Figure 4:
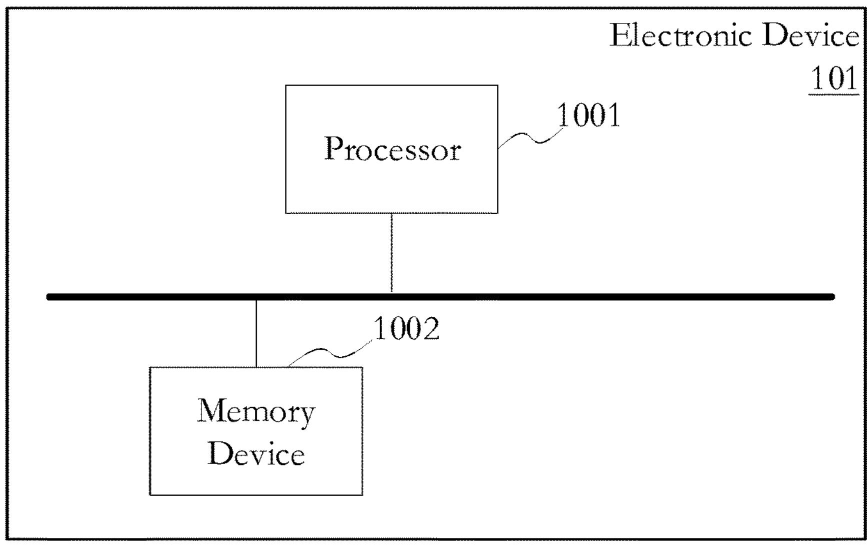
FIG. 4 is a block diagram of an electronic device according to one embodiment of the present disclosure.

As shown in FIG. 4, the present disclosure further provides an electronic device 101, comprising: a processor 1001 and a memory device 1002; the memory device 1002 stores a computer program; the processor 1001 executes the computer program, to cause the electronic device 101 to perform the method for rapid battery diagnosis based on edge computing.

Figure 5:
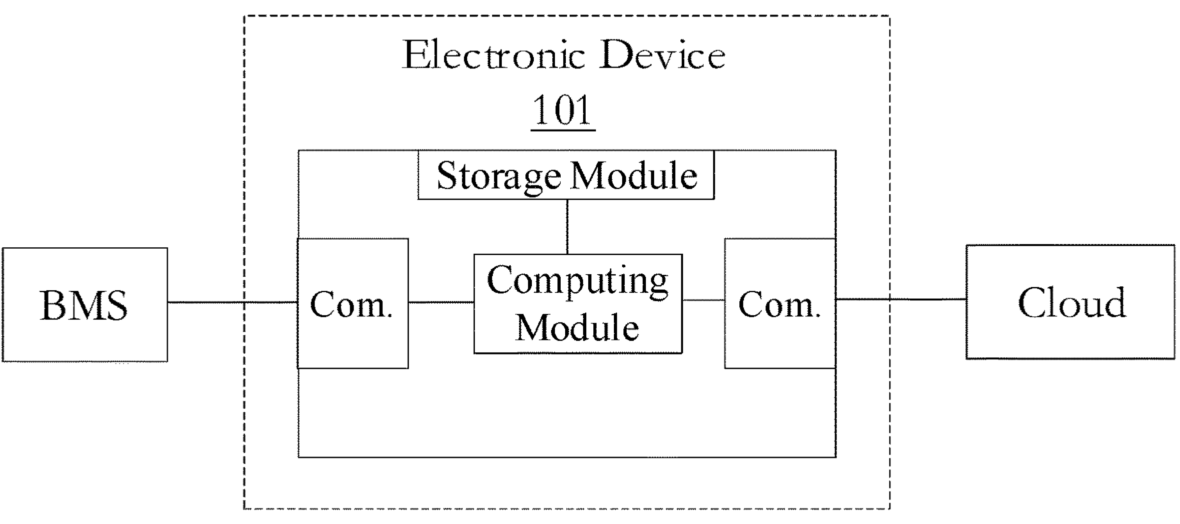
FIG. 5 is a block diagram of a network architecture for an electronic device according to one embodiment of the present disclosure.

As shown in FIG. 5, the electronic device 101 further comprises a computing module, a communication interface module (Com.), and a storage module. The electronic device 101 is connected to an BMS. The electronic device 101 obtains voltages of battery cells from a battery pack and battery charge/discharge currents from the BMS, and uploads diagnostic results to the cloud platform. The battery data from the packs of batteries collected by the electronic device 101 may be from part of an energy storage power station. The electronic device 101 analyzes, calculates, stores the battery data, and uploads the data to a cloud-based platform or sends back to the BMS.

Out of hardware units of the electronic device 101, the computing module is the core, which encapsulates fast processing algorithms; data calculation and processing cores of the computing module are preferably FPGA or GPU, and data interaction of the computing module is realized by micro-controller units (MCU). Algorithms implemented by the computing module are designed to be easily divided into code blocks corresponding to different data blocks of the matrix A[N][M] or the array B[N]. This allows for parallel computation, which significantly increases data processing throughput.

Therefore, the electronic device 101 realizes fast and effective executing algorithms for analyzing and testing battery pack data, and realizes real-time rapid battery data processing and analysis on edge devices; the algorithms can be easily transplanted to FPGA and GPU for parallel computation, which increases the throughput of data processing. The present disclosure therefore reduces the burden on cloud computing, and improves the safety of the entire power station.

The processor 1001 is a Central Processing Unit (CPU). The memory 1002 is connected to and communicates with the processor 1001 through a system bus, and the memory 1002 is configured to store a computer program, and the processor 1001 is configured execute the computer program to enable processor 1001 to perform the above-mentioned method for rapid battery diagnosis based on edge computing. The memory 1002 may include Random Access Memory (RAM), or may also include non-volatile memory, such as at least one disk memory.

The present disclosure further provides a non-transitory computer-readable storage medium on which a computer program is stored, wherein when executed by a processor, the computer program implements the above-mentioned method for rapid battery diagnosis based on edge computing.

It may be appreciated by those of ordinary skill in the art that all or some of the steps that implement the method embodiments described above may be accomplished by hardware related to computer programs. The computer program may be stored in a computer readable storage medium. Operations of the methods are performed when the program is executed; and the storage media comprises an ROM, an RAM, a magnetic disk, an optical disk, or any other non-transitory media that can store software programs.

In summary, the present disclosure allows for more precise and rapid processing of battery data on edge devices, enables a quick diagnosis of battery performance, and is easily scalable. Therefore, the present disclosure effectively overcomes various shortcomings in the existing technology and has high industrial utilization value.

The above-mentioned embodiments are merely illustrative of the principle and effects of the present disclosure instead of restricting the scope of the present disclosure. Those skilled in the art can make modifications or changes to the above-mentioned embodiments without going against the spirit and the range of the present disclosure. Therefore, all equivalent modifications or changes made by those skilled in the art without departing from the spirit and technical concepts disclosed by the present disclosure should still be covered by the attached claims of the present disclosure.

What is claimed is:

1. A method for rapid battery diagnosis based on edge computing, comprising:

periodically collecting battery information data from a battery pack in an energy storage station through a battery management system at a preset frequency; wherein the battery management system controls battery cells in the battery pack, wherein the battery information data comprises voltages of battery cells of the battery pack and battery charge/discharge currents;

saving the voltages of the battery cells in a two-dimensional matrix in an order of collection, and saving the battery charge/discharge currents in a one-dimensional array in the order of collection;

employing the first-order differential operators to perform horizontal convolution and vertical convolution on the two-dimensional matrix, respectively, to obtain a convolution result comprising horizontal gradient values and vertical gradient values;

identifying secondary convolution results that fall outside an underperforming threshold range based on the primary convolution results; and detecting anomalies in the battery information data based on the secondary convolution results and the battery information data.

2. The method for rapid battery diagnosis based on edge computing according to claim 1, before employing the first-order differential operators to perform horizontal convolution and vertical convolution on the two-dimensional matrix, respectively, further comprising:

selecting 3×3 first-order differential operators as initial first-order differential operators;

expanding the initial first-order differential operators to obtain the first-order differential operators used to perform convolution, by expanding a first one of the initial first-order differential operators horizontally to obtain an M×3 matrix and expanding a second one of the initial first-order differential operators vertically to obtain an N×3 matrix, wherein M is a total number of cells connected in series in the battery pack, and N is a total number of times that the battery information data has been collected, and M and N are both positive integers.

3. The method for rapid battery diagnosis based on edge computing according to claim 1, wherein during employing the first-order differential operators to perform the horizontal convolution and the vertical convolution on the two-dimensional matrix, each of the first-order differential operators moves with a step size of one.

4. The method for rapid battery diagnosis based on edge computing according to claim 1, wherein detecting the anomalies in the battery information data based on the secondary convolution results and the battery information data comprises:

if a first horizontal gradient value of the horizontal gradient values is not within a horizontal gradient range, retrieving first voltages of the voltages of the battery cells corresponding to the first horizontal gradient value from the two-dimensional matrix, calculating a voltage difference between two neighboring battery cells based on the first voltages, and determining whether or not there exists a battery cell consistency abnormality within the battery pack based on magnitudes of the voltage difference between the two neighboring battery cells and a voltage difference threshold; and if a first vertical gradient value of the vertical gradient values is not within a vertical gradient range, retrieving second voltages of the voltages of the cells corresponding to the first vertical gradient value from the two-dimensional matrix, calculating a rate of voltage change with respect to time within a duration between two time points based on the second voltages, and determining whether or not there exist a battery cell within the battery pack that has a voltage abnormality, based on a magnitude of the rate of voltage change and a preset rate-of-voltage-change threshold.

5. The method for rapid battery diagnosis based on edge computing according to claim 1, wherein detecting the anomalies in the battery information data based on the secondary convolution results and the battery information data further comprises:

if a first vertical gradient value of the vertical gradient values is not within a vertical gradient range, retrieving second voltages of the voltages of the battery cells corresponding to the first vertical gradient value from the two-dimensional matrix, calculating two or more values of a rate of voltage change with respect to time within different durations based on the second voltages, and retrieving the battery charge/discharge currents from the one-dimensional array; and determining whether there exists a battery cell within the battery pack that has a voltage abnormality, based on whether the rate of voltage change varies with time in a same trend as the battery charge/discharge currents.

6. A non-transitory storage medium, which stores program instructions, wherein the program instructions when executed implement the method for rapid battery diagnosis based on edge computing according to claim 1.

7. An electronic device, comprising a memory device configured to store a computer program; and a processor configured to execute the computer program to implement the method for rapid battery diagnosis based on edge computing according to claim 1.

* * * * *